(12) United States Patent
Chou et al.

(10) Patent No.: US 11,187,254 B2
(45) Date of Patent: Nov. 30, 2021

(54) BEARING BASE

(71) Applicant: SYNCMOLD ENTERPRISE CORP., New Taipei (TW)

(72) Inventors: Chih-Hsin Chou, New Taipei (TW); Tung-Chiung Chen, New Taipei (TW)

(73) Assignee: SYNCMOLD ENTERPRISE CORP., New Taipei (TW)

( * ) Notice: Subject to any disclaimer, the term of this patent is extended or adjusted under 35 U.S.C. 154(b) by 26 days.

(21) Appl. No.: 16/864,760

(22) Filed: May 1, 2020

(65) Prior Publication Data

US 2020/0348720 A1    Nov. 5, 2020

Related U.S. Application Data

(60) Provisional application No. 62/842,054, filed on May 2, 2019.

(30) Foreign Application Priority Data

Mar. 5, 2020   (TW) .................................. 109202452

(51) Int. Cl.
| | |
|---|---|
| *G06F 1/16* | (2006.01) |
| *F16B 2/04* | (2006.01) |
| *F16M 11/24* | (2006.01) |
| *F16B 9/02* | (2006.01) |
| *F16M 13/02* | (2006.01) |
| *H05K 5/02* | (2006.01) |
| *B25J 15/06* | (2006.01) |

(52) U.S. Cl.
CPC ............. *F16B 2/04* (2013.01); *B25J 15/0625* (2013.01); *F16B 9/02* (2013.01); *F16M 11/24* (2013.01); *F16M 13/02* (2013.01); *G06F 1/1601* (2013.01); *H05K 5/0234* (2013.01); *F16M 2200/08* (2013.01); *G06F 2200/1612* (2013.01)

(58) Field of Classification Search
CPC ...... G06F 1/1601; G06F 1/1607; F16M 13/02
See application file for complete search history.

(56) References Cited

U.S. PATENT DOCUMENTS 7,909,295 B2 * 3/2011 Powers ................. G06F 1/1601
                                                      248/121
9,218,019 B2 * 12/2015 Quijano .................... G06F 1/16
(Continued)

FOREIGN PATENT DOCUMENTS

TW             M589419 U         1/2020

*Primary Examiner* — Bradley Duckworth
(74) *Attorney, Agent, or Firm* — Muncy, Geissler, Olds & Lowe, P.C.

(57) ABSTRACT

A bearing base detachably disposed on a display support for carrying an electronic device is provided. The display support has an upright and a through slot penetrating through the upright. A display with a cable is mounted to the display support. The bearing base includes a bearing plate, a first clamping member and a second clamping member. The electronic device is disposed on the bearing plate, and the first clamping member connects with the bearing plate. The first clamping member has a first through hole and the second clamping member has a second through hole. The first clamping member and the second clamping member clamp on the upright, and the first through hole and the second through hole are connected in the through slot, to allow the cable of the display passing therethrough.

10 Claims, 5 Drawing Sheets

(56) References Cited

U.S. PATENT DOCUMENTS

| | | | | |
|---|---|---|---|---|
| 9,285,832 B2* | 3/2016 | Galant | ................... | G06F 21/88 |
| 9,797,547 B2* | 10/2017 | Meyer | ................... | F16M 13/02 |
| 10,492,316 B2* | 11/2019 | Sung | ................... | G06F 1/1607 |
| 10,524,369 B2* | 12/2019 | Chiu | ................... | G06F 1/1607 |
| 2013/0058030 A1* | 3/2013 | Mabon | ................ | G11B 33/124 |
| | | | | 361/679.32 |

* cited by examiner

BEARING BASE

CROSS REFERENCE TO RELATED APPLICATION

This application claims benefit of U.S. Provisional Application Ser. No. 62/842,054, filed on May 2, 2019, and the benefit of Taiwan Patent Application Serial No. 109202452 filed on Mar. 5, 2020. The entirety of each said Application is incorporated herein by reference.

BACKGROUND OF THE INVENTION

1. Field of the Invention

The present invention relates to a bearing base, particularly to a bearing base carrying a computer with cable arrangement.

2. Description of Related Art

Taiwan Patent No. M589419 discloses a bearing base disposed on a support frame for carrying a mini computer. Cables of the computer or monitor may also be arranged in a designated space.

However, the conventional bearing base is attached to the cover of the upright by using screws in order to make the bearing base firmly attach on the upright to ensure the stability when a computer is mounted. The corresponding screw holes are required on the cover of the upright. Not only the manufacturing processes of the upright are increased, but also the installation of the bearing base is more complicated.

SUMMARY OF THE INVENTION

The object of the present invention is to provide a bearing base which clamps the upright and is partially coupled in the through slot of the upright, so that extra manufacturing process for screw holes on the cover of the upright may be eliminated. The bearing base of the present invention is directly mounted on the display support without screws and capable of carrying an electronic device. The first through hole and second through hole of the bearing base of the present invention are connected via the through slot, allowing cables of the display such as power cord to pass through the first through hole and second through hole for a neat cable arrangement.

To achieve above mentioned object, the present invention provides a bearing base for carrying the electronic device and is detachably mounted on a support frame. The support frame includes an upright and a through slot penetrating through the upright. A display having a cable is attached to the support frame. The bearing base includes a bearing plate, a first clamping member and a second clamping member. The bearing plate is to carry the electronic device, and the first clamping member is fixed to the bearing plate. The first clamping member comprises a first engaging element and a first through hole penetrating through the first engaging element. The second clamping member comprises a second engaging element and a second through hole penetrating through the second engaging element. The first engaging element and the second engaging element clamp the upright, and the first through hole and the second through hole are intercommunicated with each other in the through slot, and the cable of the display passes through the first through hole and the second through hole.

The first engaging element has a first board body and a first sleeve body, wherein the first sleeve body extends from the first board body. The second engaging element has a second board body and a second sleeve body, wherein the second sleeve body extends from the second board body. The first sleeve body and the second sleeve body couple to each other in the through slot.

When the first sleeve body and the second sleeve body are coupled to each other in the through slot, the first board body and the second board body respectively extend outside the through slot.

The bearing plate has a main body and a fixing member angularly extending from the main body, and the fixing member passes through the first board body and is connected to the first sleeve body.

The first sleeve body is accommodated in the through slot and the second sleeve body is accommodated in the first through hole when the first sleeve body and the second sleeve body are coupled to each other in the through slot.

The first sleeve body has two inner side surfaces opposite to each other, and an inner bottom surface connected therebetween. The second sleeve body has two outer side surfaces opposite to each other, an outer bottom surface connected therebetween, and a plurality of ribs spaced apart from one another on the outer side surfaces and the outer bottom surface. The ribs contact with the inner side surfaces and the inner bottom surface of the first sleeve body when the second sleeve body is fitted in the first through hole.

The first sleeve body has an inner top surface connected between the inner side surfaces and opposite to the inner bottom surface. The second sleeve body has an outer top surface connected between the outer side surfaces and opposite to the outer bottom surface. The fixing member is disposed between the inner top surface and the outer top surface.

A protrusion is formed on each of the inner side surfaces of the first sleeve body, and a hole is formed on each of the outer side surfaces. The protrusions are positioned in the holes when the second sleeve body is fitted in the first through hole.

The bearing base of the present invention further includes a first buffer pad disposed on the first board body. The first buffer pad is in contact with the upright when the first engaging element and the second engaging element are clamping the upright.

The bearing base of the present invention further includes a second buffer pad disposed on a first surface of the main body of the bearing plate. The second buffer pad and the electronic device are partially in contact when the electronic device is attached to the bearing plate.

The bearing base of the present invention further includes a third buffer pad disposed on a second surface opposite to the first surface of the main body. The third buffer pad and the upright are in contact when first board body and the second board body are clamping the upright.

The bearing base of the present invention further includes a locking piece penetrating through the first clamping member and securing to the second clamping member. The locking piece includes a head portion and a rod portion connecting to the head portion. The head portion abuts the first board body and the rod portion penetrates through the first board body and secures to the second board body.

Purposes, technical details and other features of the present invention will become readily apparent upon further review of the following embodiments and drawings.

DETAILED DESCRIPTION OF THE PREFERRED EMBODIMENT

Figure 1:
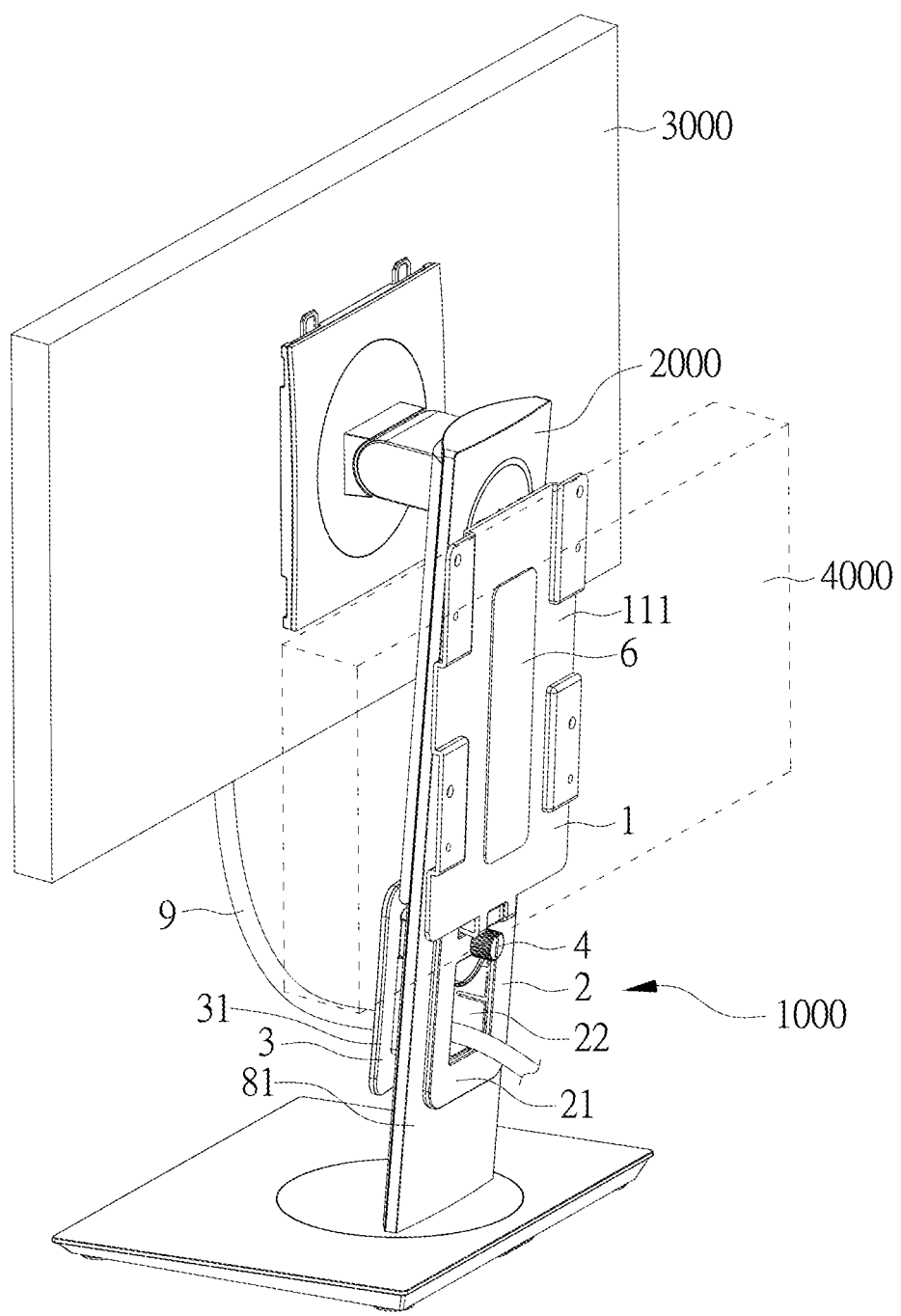
FIG. 1 is a perspective view of an embodiment of the bearing base according to the present invention, while carrying an electronic device and being disposed on a display support.
Figure 2:
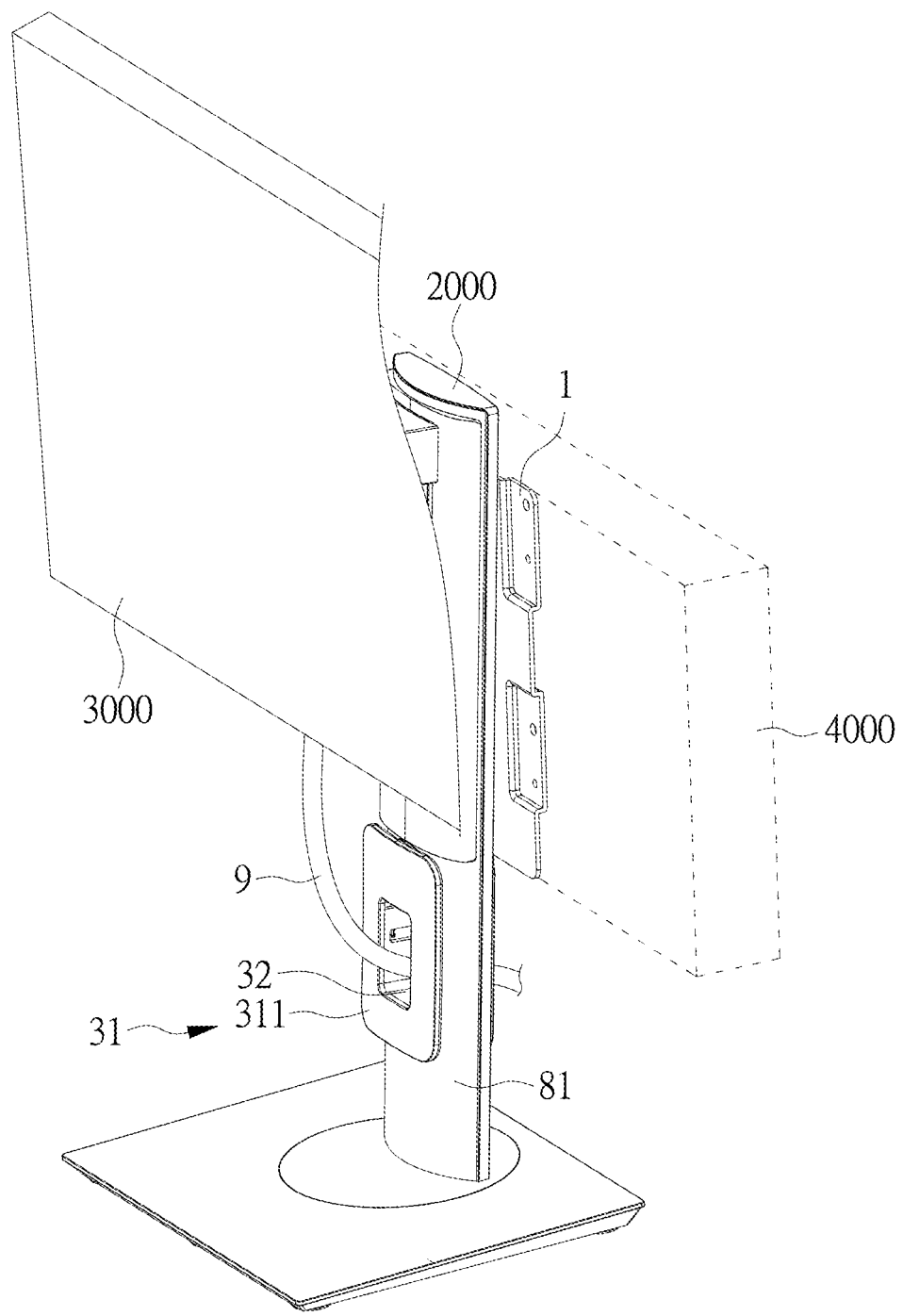
FIG. 2 is a perspective view of FIG. 1 from another view angle.
Figure 3:
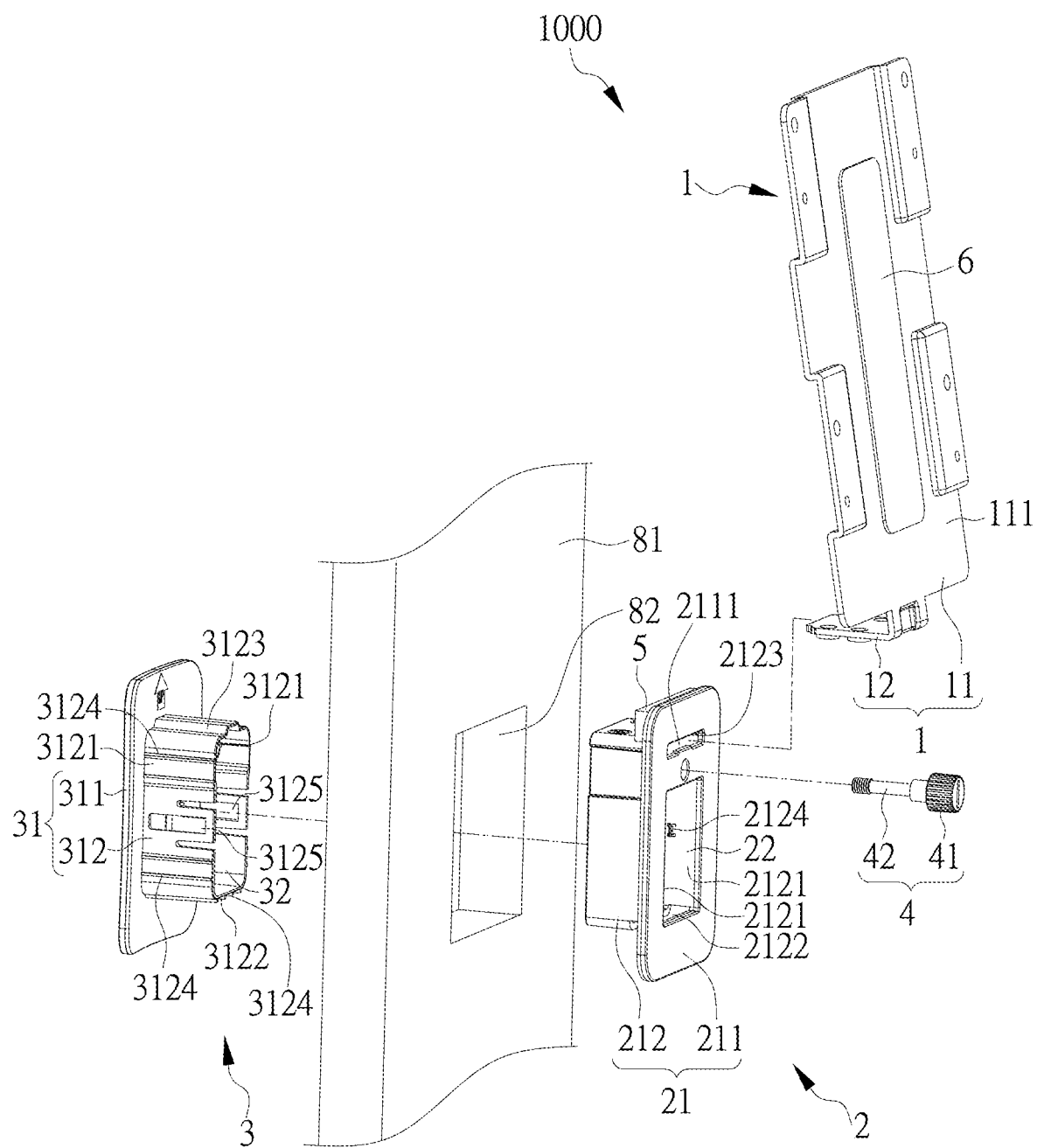
FIG. 3 is an exploded view of the bearing base according to the present invention.

With reference to FIGS. 1, 2 and 3, the bearing base 1000 of the present invention is attachably disposed on a display support 2000, and designed for carrying an electronic device 4000, such as a Mini PC, tablet PC or similar electronic devices. The display support 2000 has an upright 81 and a through slot 82 penetrating through the upright 81. A display 3000 comprising a cable 9 is attached to the display support 2000. Therefore the display support 2000 and the bearing base 1000 may carry the display 3000 and the electronic device 4000.

Figure 4:
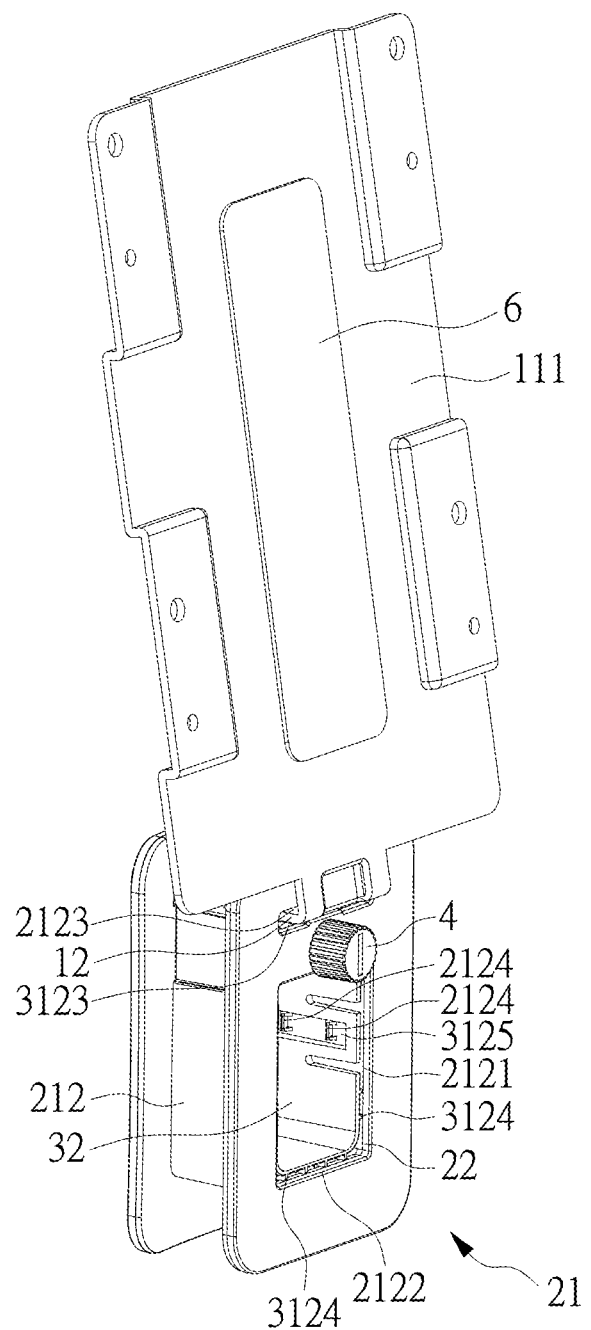
FIG. 4 is a perspective view of the bearing base according to the present invention.
Figure 5:
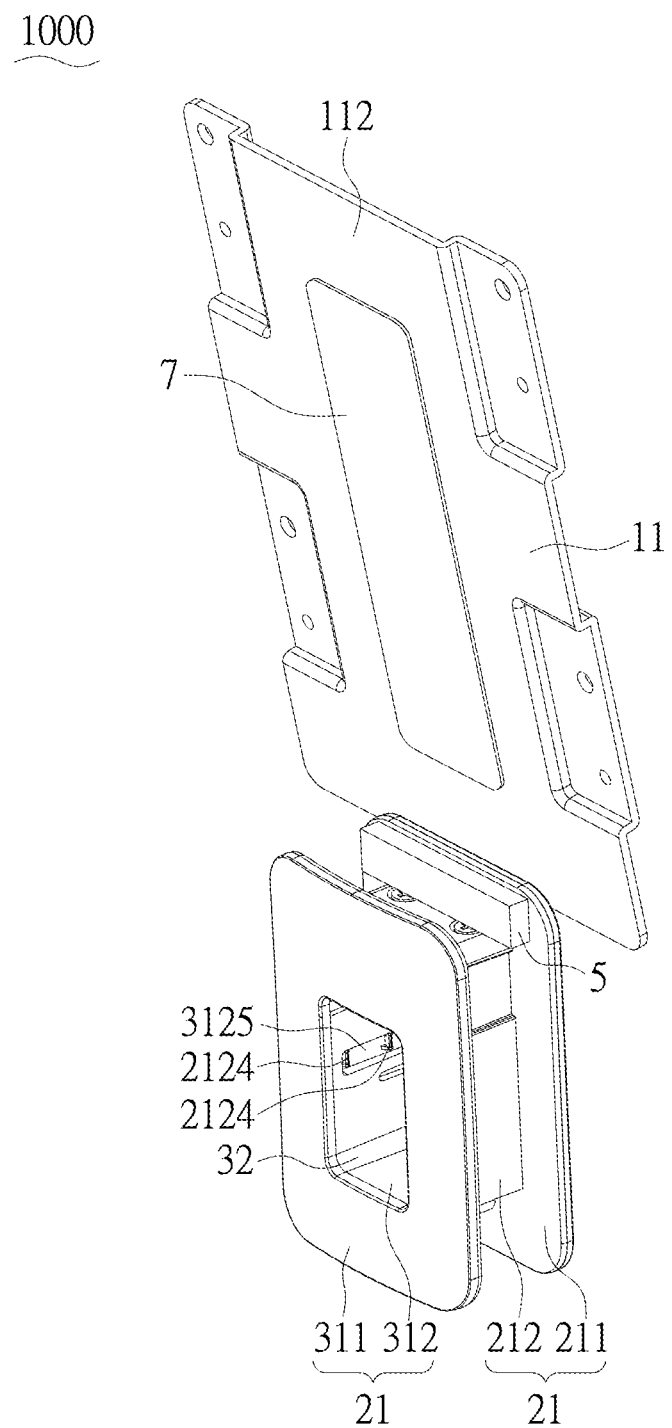
FIG. 5 is a perspective view of FIG. 4 from another view angle.

With reference to FIGS. 3, 4 and 5, the bearing base 1000 includes a bearing plate 1, a first clamping member 2, a second clamping member 3, a locking piece 4, a first buffer pad 5, a second buffer pad 6, and a third buffer pad 7. Structures and connecting relationships between those elements will be described in the following.

The bearing plate 1 comprises a main body 11 and a fixing member 12 angularly extending from the main body 11. The main body 11 is used for carrying the electronic device 4000, for example, the electronic device 4000 is directly fastened to the main body 11.

The first clamping member 2 comprises a first engaging element 21 and a first through hole 22 penetrating through the first engaging element 21. The first engaging element 21 includes a first board body 211 and a first sleeve body 212 extending from the first board body 211. The first sleeve body 212 has two opposite inner side surfaces 2121, an inner bottom surface 2122, an inner top surface 2123, and at least one protrusion 2124. The inner bottom surface 2122 is connected between the inner side surfaces 2121, and the inner top surface 2123 is connected between the two inner side surfaces 2121 and opposite to the inner bottom surface 2122. In this embodiment, the number of the at least one protrusion 2124 is four. The protrusions 2124 are formed on the inner side surfaces 2121.

The second clamping member 3 comprises a second engaging element 31 and a second through hole 32 penetrating through the second engaging element 31. The second engaging element 31 includes a second board body 311 and a second sleeve body 312 extending from the second board body 311. The second sleeve body 312 has two opposite outer side surfaces 3121, an outer bottom surface 3122, an outer top surface 3123, a plurality of ribs 3124 and holes 3125. The outer bottom surface 3122 is connected between the two outer side surfaces 3121, and the outer top surface 3123 is connected between the two outer side surfaces 3121 and opposite to the outer bottom surface 3122. The ribs 3124 are formed on the outer side surfaces 3121 and the outer bottom surface 3122 with intervals therebetween. At least one of the holes 3125 is formed on each of the outer side surfaces 3121.

The connecting relationship between the first clamping member 2, the second clamping member 3 and the upright 81 is described herefrom. When the first engaging element 21 and the second engaging element 31 are clamping the upright 81, the first sleeve body 212 and the second sleeve body 312 are coupled to each other in the through slot 82. In this embodiment, the first sleeve body 212 is accommodated in the through slot 82, and the second sleeve body 312 is accommodated in the first through hole 22. The ribs 3124 are in contact with the inner side surfaces 2121 and the inner bottom surface 2122 of the first sleeve body 212, and the protrusions 2124 are positioned in the holes 3125 correspondingly. At the same time, the first board body 211 and the second board body 311 respectively extend outside the through slot 82 and abut against surfaces of the upright 81. Therefore, the first through hole 22 and the second through hole 32 are intercommunicated with each other in the through slot 82, and the cable 9 of the display 3000 may pass the first through hole 22 and the second through hole 32. The bearing base 1000 of the present invention hence supports the cable management. Through the coordination between the protrusions 2124 and the holes 3125, a quick and accurate positioning may be achieved when a user is assembling the first clamping member 2 and the second clamping member 3. The ease and convenience for installing the bearing base 1000 of the present invention to the display support 2000 are enhanced.

The connecting relationship between the bearing plate 1, the first clamping member 2, and the second clamping member 3 will be described herefrom. The fixing member 12 passes through a connecting hole 2111 of the first board body 211 and attaches to the first sleeve body 212, so that the fixing member 12 is positioned between the inner top surface 2123 of the first clamping member 2 and the outer top surface 3123 of the second clamping member 3.

The locking member 4 comprises a head portion 41 and a rod portion 42 connecting to the head portion 41. When the first clamping member 2 and the second clamping member 3 are respectively clamping on the upright 81 from the front and the back, the head portion 41 of the locking member 4 abuts the first board body 211, and the rod portion 42 penetrates through the first board body 211 and secures to the second board body 311. The first clamping member 2 and the second clamping member 3 may firmly clamp on the upright 81 with the locking member 4 without any unexpected loose.

It should be noted that in other embodiments of the present invention, the second sleeve body 312 may be accommodated in the through slot 82, and the first sleeve body 212 may be accommodated in the second through hole 32. Same results may be achieved as the embodiment described above. Also, in other embodiments of the present invention, the first sleeve body 212 and the second sleeve body 312 may respectively engage to the through slot 82 without coupling to each other. The first board body 211 and the second board body 311 may be attached to each other by using the locking member 4, and the same effect of the upright 81 being clamped by the first clamping member 2 and the second clamping member 3 is still achieved.

Buffer pads may be utilized to avoid frictions and impacts between components. In this embodiment, the first buffer pad 5 is disposed on the first board body 211, and the first pad 5 is in contact with the upright 81 when the first engaging element 21 and the second engaging element 31 are clamping the upright 81. Therefore, damages to the upright 81 due to excessive clamping force from the first board body 211 may be avoided.

The second buffer pad 6 is disposed on a first surface 111 of the main body 11. The second buffer pad 6 is in contact with the electronic device 4000 to avoid direct impact between the electronic device 4000 and the bearing plate 1 when the electronic device 4000 is attached to the bearing plate 1.

The main body 11 of the bearing plate 1 comprises a second surface 112 opposite to the first surface 111, and the third buffer pad 7 is disposed on the second surface 112. The third buffer pad 7 is in contact with the upright 81 when the first engaging element 21 and the second engaging element 31 are clamping the upright 81. The third buffer pad 7 may avoid direct impact between the bearing plate 1 and the upright 81 in case of movement of bearing plate 1 when a user moves the display support 2000.

Sizes, quantities and positions of the first buffer pad 5, the second buffer pad 6, and the third buffer pad 7 may be adjusted as required in other embodiments of the present invention. For example, there may be a plurality of the first buffer pads 5 respectively disposed on the first board body 211 and the second board body 311 and so on.

While the foregoing details what is felt to be the preferred embodiment of the invention, no material limitations to the scope of the claimed invention are intended. Further, features and design alternatives that would be obvious to one of ordinary skill in the art are considered to be incorporated herein. The scope of the invention is set forth and particularly described in the claims herein below.

What is claimed is:

1. A bearing base, detachably disposed on a display support, having an upright and a through slot penetrating through the upright, and the bearing base including:
   a bearing plate having a main body and a fixing member angularly extending from the main body;
   a first clamping member being fixed to the bearing plate and including a first engaging element and a first through hole penetrating through the first engaging element, and the first engaging element comprising a first board body and a first sleeve body extending from the first board body;
   a second clamping member including a second engaging element and a second through hole penetrating through the second engaging element, and the second engaging element comprising a second board body and a second sleeve body extending from the second board body;
   wherein the first engaging element and the second engaging element clamp the upright, and the first through hole and the second through hole are intercommunicated with each other in the through slot, the first board body and the second board body respectively extend outside the through slot when the first sleeve body and the second sleeve body are coupled to each other in the through slot, and the fixing member passes through the first board body and is connected to the first sleeve body.

2. The bearing base of claim 1, wherein the first sleeve body is accommodated in the through slot and the second sleeve body is accommodated in the first through hole when the first sleeve body and the second sleeve body are coupled to each other in the through slot.

3. The bearing base of claim 2, wherein the first sleeve body has two inner side surfaces opposite to each other and an inner bottom surface connected therebetween, the second sleeve body has two outer side surfaces opposite to each other, an outer bottom surface connected therebetween, and a plurality of ribs spaced apart from one another on the outer side surfaces and the outer bottom surface, and the ribs contact with the inner side surfaces and the inner bottom surface of the first sleeve body when the second sleeve body is fitted in the first through hole.

4. The bearing base of claim 3, wherein the first sleeve body includes an inner top surface connected between the inner side surfaces and opposite to the inner bottom surface, and the second sleeve body includes an outer top surface connected between the outer side surfaces and opposite to the outer bottom surface, wherein the fixing member is disposed between the inner top surface and the outer top surface.

5. The bearing base of claim 4, wherein a protrusion is formed on each of the inner side surfaces of the first sleeve body, and a hole is formed on each of the outer side surfaces, wherein the protrusions are positioned in the holes when the second sleeve body is fitted in the first through hole.

6. The bearing base of claim 5, further including a first buffer pad disposed on the first board body, wherein the first buffer pad is in contact with the upright when the first engaging element and the second engaging element are clamping the upright.

7. The bearing base of claim 6, further including a second buffer pad disposed on a first surface of the main body of the bearing plate.

8. The bearing base of claim 7, further including a third buffer pad disposed on a second surface opposite the first surface of the main body, wherein the third buffer pad and the upright are in contact when the first board body and the second board body are clamping the upright.

9. The bearing base of claim 1, further including a locking piece penetrating through the first clamping member and securing to the second clamping member.

10. The bearing base of the claim 9, wherein the locking piece includes a head portion and a rod portion connecting to the head portion, wherein the head portion abuts the first board body and the rod portion penetrates through the first board body and secures to the second board body.

* * * * *